(12) United States Patent
Johnson et al.

(10) Patent No.: US 9,978,858 B2
(45) Date of Patent: May 22, 2018

(54) METHODS OF MANUFACTURING GALLIUM NITRIDE DEVICES

(71) Applicant: Infineon Technologies Americas Corp., El Segundo, CA (US)

(72) Inventors: Jerry Wayne Johnson, Raleigh, NC (US); Sameer Singhal, Apex, NC (US); Allen W. Hanson, Cary, NC (US); Robert Joseph Therrien, Apex, NC (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days. days.

(21) Appl. No.: 15/433,473

(22) Filed: Feb. 15, 2017

(65) Prior Publication Data

US 2017/0154989 A1 Jun. 1, 2017

Related U.S. Application Data

(62) Division of application No. 11/607,129, filed on Nov. 30, 2006, now Pat. No. 9,608,102.

(Continued)

(51) Int. Cl.
*H01L 29/778* (2006.01)
*H01L 29/20* (2006.01)
(Continued)

(52) U.S. Cl.
CPC ...... *H01L 29/7787* (2013.01); *H01L 29/2003* (2013.01); *H01L 29/402* (2013.01);
(Continued)

(58) Field of Classification Search
CPC ... H01L 29/2003; H01L 29/78; H01L 29/778; H01L 29/7789
See application file for complete search history.

(56) References Cited

U.S. PATENT DOCUMENTS

| 4,843,440 A | 6/1989 | Huang |
| 5,192,987 A | 3/1993 | Khan et al. |

(Continued)

FOREIGN PATENT DOCUMENTS

| EP | 0887854 A1 | 12/1998 |
| JP | H11163228 A | 6/1999 |
| WO | 0113436 A1 | 2/2001 |

OTHER PUBLICATIONS

Paidi et al, High Linearity and High Efficiency of Class-B Power Amplifiers in GaN HEMT Technology, IEEE Transactions on Microwave Theory and Techniques, Vo.51, Feb. 2003, pp. 643-652.*

(Continued)

*Primary Examiner* — Julia Slutsker
(74) *Attorney, Agent, or Firm* — Murphy, Bilak & Homiller, PLLC

(57) ABSTRACT

Gallium nitride material devices and methods associated with the same. In some embodiments, the devices may be transistors which include a conductive structure connected to a source electrode. The conductive structure may form a source field plate which can be formed over a dielectric material and can extend in the direction of the gate electrode of the transistor. The source field plate may reduce the electrical field (e.g., peak electrical field and/or integrated electrical field) in the region of the device between the gate electrode and the drain electrode which can lead to a number of advantages including reduced gate-drain feedback capacitance, reduced surface electron concentration, increased breakdown voltage, and improved device reliability. These advantages enable the gallium nitride material transistors to operate at high drain efficiencies and/or high output powers. The devices can be used in RF power applications, amongst others.

20 Claims, 11 Drawing Sheets

Related U.S. Application Data

(60) Provisional application No. 60/741,608, filed on Dec. 2, 2005.

(51) Int. Cl.
| | | |
|---|---|---|
| *H01L 29/40* | (2006.01) | |
| *H01L 29/417* | (2006.01) | |
| *H01L 29/423* | (2006.01) | |
| *H01L 29/66* | (2006.01) | |

(52) U.S. Cl.
CPC .. *H01L 29/41725* (2013.01); *H01L 29/42316* (2013.01); *H01L 29/66462* (2013.01)

(56) References Cited

U.S. PATENT DOCUMENTS

| | | |
|---|---|---|
| 5,239,188 A | 8/1993 | Takeuchi et al. |
| 5,290,393 A | 3/1994 | Nakamura |
| 5,296,395 A | 3/1994 | Khan et al. |
| 5,389,571 A | 2/1995 | Takeuchi et al. |
| 5,393,993 A | 2/1995 | Edmond et al. |
| 5,523,589 A | 6/1996 | Edmond et al. |
| 5,633,192 A | 5/1997 | Moustakas et al. |
| 5,679,965 A | 10/1997 | Schetzina |
| 5,739,554 A | 4/1998 | Edmond et al. |
| 5,741,724 A | 4/1998 | Ramdani et al. |
| 5,760,426 A | 6/1998 | Marx et al. |
| 5,786,606 A | 7/1998 | Nishio et al. |
| 5,815,520 A | 9/1998 | Furushima et al. |
| 5,838,029 A | 11/1998 | Shakuda |
| 5,838,706 A | 11/1998 | Edmond et al. |
| 5,874,747 A | 2/1999 | Redwing et al. |
| 5,929,467 A | 7/1999 | Kawai et al. |
| 6,051,849 A | 4/2000 | Davis et al. |
| 6,064,078 A | 5/2000 | Northrup et al. |
| 6,064,082 A | 5/2000 | Kawai et al. |
| 6,069,021 A | 5/2000 | Terashima et al. |
| 6,100,545 A | 8/2000 | Chiyo et al. |
| 6,120,600 A | 9/2000 | Edmond et al. |
| 6,121,121 A | 9/2000 | Koide et al. |
| 6,139,628 A | 10/2000 | Yuri et al. |
| 6,146,457 A | 11/2000 | Solomon |
| 6,153,010 A | 11/2000 | Chocho et al. |
| 6,156,581 A | 12/2000 | Brown et al. |
| 6,177,688 B1 | 1/2001 | Linthicum et al. |
| 6,180,270 B1 | 1/2001 | Xie et al. |
| 6,201,262 B1 | 3/2001 | Edmond et al. |
| 6,255,198 B1 | 7/2001 | Linthicum et al. |
| 6,261,929 B1 | 7/2001 | Gehrke et al. |
| 6,261,931 B1 | 7/2001 | Keller et al. |
| 6,265,289 B1 | 7/2001 | Davis et al. |
| 6,291,319 B1 | 9/2001 | Ramdani et al. |
| 6,329,063 B2 | 12/2001 | Ejeckam et al. |
| 6,380,108 B1 | 4/2002 | Linthicum |
| 6,391,748 B1 | 5/2002 | Temkin et al. |
| 6,403,451 B1 | 6/2002 | Linthicum et al. |
| 6,420,197 B1 | 7/2002 | Ishida et al. |
| 6,426,512 B1 | 7/2002 | Ito et al. |
| 6,440,823 B1 | 8/2002 | Vaudo et al. |
| 6,441,393 B2 | 8/2002 | Goetz et al. |
| 6,459,712 B2 | 10/2002 | Tanaka et al. |
| 6,465,814 B2 | 10/2002 | Kasahara et al. |
| 6,486,502 B1 | 11/2002 | Sheppard et al. |
| 6,498,111 B1 | 12/2002 | Kapolnek et al. |
| 6,521,514 B1 | 2/2003 | Gehrke et al. |
| 6,524,932 B1 | 2/2003 | Zhang et al. |
| 6,548,333 B2 | 4/2003 | Smith et al. |
| 6,583,034 B2 | 6/2003 | Hilt et al. |
| 6,583,454 B2 | 6/2003 | Sheppard et al. |
| 6,586,781 B2 | 7/2003 | Xu et al. |
| 6,610,144 B2 | 8/2003 | Mishra et al. |
| 6,611,002 B2 | 8/2003 | Weeks et al. |
| 6,617,060 B2 | 9/2003 | Weeks, Jr. et al. |
| 6,624,452 B2 | 9/2003 | Yu et al. |
| 6,649,287 B2 | 11/2003 | Weeks, Jr. et al. |
| 6,765,240 B2 | 7/2004 | Vaudo et al. |
| 6,765,241 B2 | 7/2004 | Ohno et al. |
| 6,777,278 B2 | 8/2004 | Smith et al. |
| 6,841,409 B2 | 1/2005 | Onishi et al. |
| 6,849,882 B2 | 2/2005 | Chavarkar et al. |
| 6,956,250 B2 | 10/2005 | Borges et al. |
| 7,071,498 B2 | 7/2006 | Johnson et al. |
| 7,135,720 B2 | 11/2006 | Nagy et al. |
| 7,161,194 B2 | 1/2007 | Parikh et al. |
| 7,233,028 B2 | 6/2007 | Weeks et al. |
| 7,247,889 B2 | 7/2007 | Hanson et al. |
| 7,339,205 B2 | 3/2008 | Piner et al. |
| 7,352,015 B2 | 4/2008 | Piner et al. |
| 7,352,016 B2 | 4/2008 | Nagy et al. |
| 2001/0042503 A1 | 11/2001 | Lo et al. |
| 2002/0020341 A1 | 2/2002 | Marchand et al. |
| 2003/0136333 A1 | 7/2003 | Semond et al. |
| 2005/0001235 A1 | 1/2005 | Murata et al. |
| 2005/0051800 A1 | 3/2005 | Mishra et al. |
| 2005/0062069 A1 | 3/2005 | Saito et al. |
| 2005/0133818 A1 | 6/2005 | Johnson et al. |
| 2005/0145851 A1 | 7/2005 | Johnson et al. |
| 2005/0167775 A1 | 8/2005 | Nagy et al. |
| 2005/0285141 A1 | 12/2005 | Piner et al. |
| 2005/0285142 A1 | 12/2005 | Piner et al. |
| 2006/0006500 A1 | 1/2006 | Piner et al. |
| 2006/0060895 A1* | 3/2006 | Hikita ............... H01L 29/41766 257/280 |
| 2006/0071250 A1 | 4/2006 | Bude et al. |
| 2006/0118809 A1* | 6/2006 | Parikh .................. H01L 29/402 257/103 |
| 2006/0170003 A1 | 8/2006 | Saito et al. |
| 2006/0226415 A1 | 10/2006 | Nishijima et al. |
| 2006/0249750 A1 | 11/2006 | Johnson et al. |
| 2007/0018199 A1 | 1/2007 | Sheppard et al. |
| 2007/0018210 A1 | 1/2007 | Sheppard et al. |
| 2007/0200134 A1 | 8/2007 | Therrien et al. |

OTHER PUBLICATIONS

Ando, Y. et al., "10-W/mm AlGaN-GaN HFET With a Field Modulating Plate", IEEE Electron Device Letters, vol. 4, No. 5, May 2003, 289-291.

Ando, Y. et al., "A 110-W AlGaN/GaN Heterojunction FET on Thinned Sapphire Substrate", International Electron Devices Meeting, 2001 (IEDM '01), Technical Digest, Washington, DC, US, Dec. 2-5, 2001, 6 pages.

Binari, S. C. et al., "Microwave Performance of Gan MESFETs", Electronics Letters, vol. 30, No. 15, Jul. 21, 1994, 1248-1249.

Bindra, A., "Exotic Materials Squeeze More Juice Out of RF Power Amplifiers", Electronic Design, ED Online ID #2367, Penton Media, Inc., 2002, 8 pages.

Borges, R. et al., "GaN HFETs on Silicon Target Wireless Infrastructure Market", Compound Semiconductor, Aug. 2003, 2-4.

Brown, J. D. et al., "AlGaN/GaN HFETs Fabricated on 100-m GaN on Silicon (111) Substrates", Solid State Electronics, vol. 469, 2002, 1535-1539.

Brown, J. D. et al., "Performance of AlGaN/GaN HFETs Fabricated on 100mm Silicon Substrates for Wireless Basestation Applications", Nitronex Corporation, IEEE MTT-S Digest, 2004, 833-836.

Chumbes, E. M. et al., "AlGaN/GaN High Electron Mobility Transistors on Si(111) Substrates", IEEE Transactions on Electron Devices, vol. 48, No. 3, Mar. 2001, 420-426.

Elhamri, S. et al., "An Electrical Characterization of a Two Dimensional Electron Gas in GaN/AlGaN on Siicon Substrates", J. Appl. Phys. 95(12), 2004, 7982-7989.

Fanning, D. et al., "Dielectrically Defined Optical T-Gate for High Power GaAs pHEMTS", TriQuint Semiconductor Texas, GaAsMANTECH Conference, 2002, 4 pages.

Hanson, A. W. et al., "Development of a GaN Transistor Process for Linear Power Applications", Nitronex Corporation, Paper presented at the 2004 International Conference on Compound Semiconductor Manufacturing Technology (GaAs Mantech), Miami, Florida, 2004, 4 pages.

(56) References Cited

OTHER PUBLICATIONS

Hikita, M. et al., "AlGaN/GaN Power HFET on Silicon Substrate With Source-Via Grounding (SVG) Structure", IEEE Transactions on Electron Devices, vol. 52, Issue 9, Sep. 2005, 1-6.

Johnson, J. W. et al., "12 W/mm AlGaN-GaN HFETs on Silicon Substrates", IEEE Electron Device Letters, vol. 25, No. 7, Jul. 2004, 459-461.

Johnson, J. W. et al., "Material, Process, and Device Development of GaN-Based HFETs on Silicon Substrates", Proceedings—Electrochemical Society, Jan. 2004, 15 pages.

Joshin, K. et al., "A 174 W High-Efficiency Gan HEMT Power Amplifier for W-CDMA Base Station Applications", IEEE International Electron Devices Meeting (IEDM '03), Technical Digest, Washington, DC, Dec. 8-10, 2003, 3 pages.

Kikkawa, T. et al., "An Over 200-W Output Power GaN HEMT Push-Pull Amplifier with High Reliability", IEEE MTT-S International Microwave Symposium Digest, Fort Worth, TX, Jun. 6-11, 2004, 4 pages.

Kimball, D. et al., "50% PAE WCDMA Basestation Amplifier Implemented with GaN HFETs", IEEE Compound Semiconductor Integrated Circuit Symposium, Palm Springs, CA, Oct. 30-Nov. 2, 2005, 1-4.

Nagy, W. et al., "150 W GaN-on-Si RF Power Transistor", IEEE MTT-S International Microwave Symposium Digest, Jul. 2005, 4 pages.

Nagy, W. et al., "Linearity Characteristics of Microwave Power GaN HEMTs", IEEE Transactions on Microwave Theory and Techniques, vol. 51, No. 2, Feb. 2003, 1-6.

Okamoto, Y. et al., "An 80W AlGaN/GaN Heterojunction FET with a Field-Modulating Plate", IEEE MTT-S Digest, 2003, 225-228.

Palmour, J. W. et al., "Wide Bandgap Semiconductor Devices and MMICs for RF Power Applications", International Electron Devices Meeting, Technical Digest, Washington, DC, Dec. 2-5, 2001, 4 pages.

Patel, S., "The Bottleneck on the Road to 3G", WirelessFuture Magazine, Jan.-Feb. 2003, 4 pages.

Piner, E., "GaN Transistors and Power Amplifiers Close in on Commercialization", compoundsemiconductor.net, Jul. 2004, 5 pages.

Saito, W. et al., "High Breakdown Voltage AlGaN-GaN Power-HEMT Design and High Current Density Switching Behavior", IEEE Transactions on Electron Devices, vol. 50, No. 12, Dec. 2003, 2528-2531.

Seon, M. et al., "Selective Growth of High Quality GaN on Si(111) Substrates", Applied Physics Letters, vol. 76, No. 14, Apr. 3, 2000, 1842-1844.

Singhal, S. et al., "Gallium Nitride on Silicon HEMTs for Wireless Infrastructure Applications, Thermal Design and Performance", Gallium Arsenide Applications Symposium, Milano, Sep. 23-27, 2002, 9 pages.

Singhal, S. et al., "Reliability of Large Periphery GaN-on-Si HFETs", Reliability of Compound Semiconductors Workshop, Indian Wells, CA, USA, Feb. 2005, 5 pages.

Therrien, R. et al., "A 36mm GaN-on-Si HFET Producing 368W at 60V with 70% Drain Efficiency", IEEE International Electron Devices Meeting, Washing, DC, Dec. 2005, 4 pages.

Thompson, R. et al., "Improved Fabrication Process for Obtaining High Power Density ALGaN/GaN HEMTs", IEEE GaAs Digest, 2003, 298-300.

Vescan, A. et al., "AlGaN/GaN HFETs on 100 mm Silicon Substrates for Commercial Wireless Applications", Current Topics in Solid State Physics, Dec. 19, 2002, 52-56.

* cited by examiner

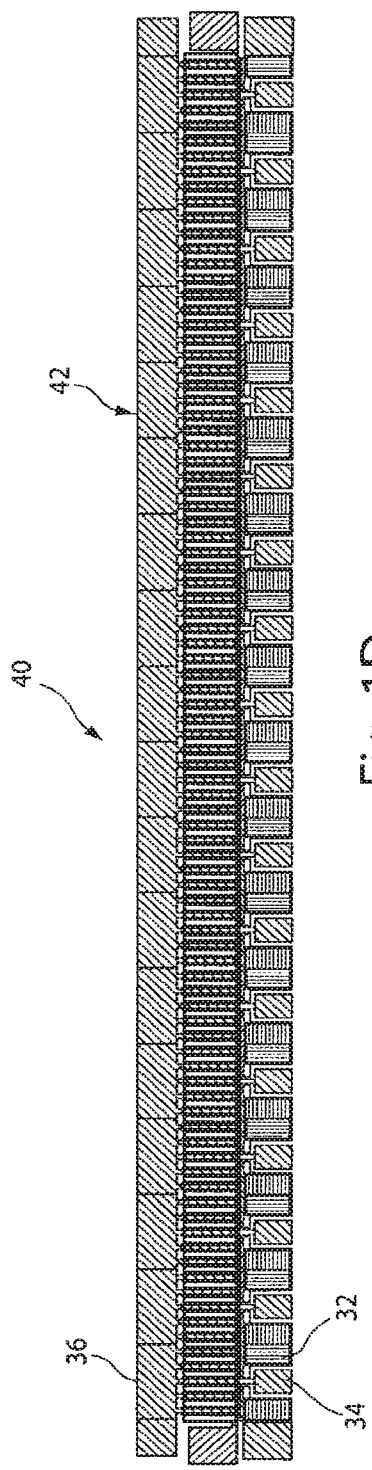

METHODS OF MANUFACTURING GALLIUM NITRIDE DEVICES

RELATED APPLICATIONS

This application claims priority to U.S. Non-Provisional patent application Ser. No. 11/607,129, filed Nov. 30, 2006, which in turn claims priority to U.S. Provisional Patent Application Ser. No. 60/741,608, filed Dec. 2, 2005, both of which are incorporated herein by reference in their entirety.

FIELD OF INVENTION

The invention relates generally to gallium nitride material devices and, more particularly, to gallium nitride material devices that include a source field plate and methods associated with the same.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Gallium nitride materials have a number of attractive properties including high electron mobility, the ability to efficiently emit blue light, and the ability to transmit signals at high frequency, amongst others. Accordingly, gallium nitride materials are being investigated in many microelectronic applications such as transistors and optoelectronic devices.

Despite the attractive properties noted above, a number of challenges exist in connection with developing gallium nitride material-based devices. For example, it may be difficult to grow high quality gallium nitride materials on certain substrates, particularly silicon, due to property differences (e.g., lattice constant and thermal expansion coefficient) between the gallium nitride material and the substrate material. Also, it is has been challenging to form gallium nitride material devices meeting the property requirements for certain applications.

Applications for RF power transistors may have particularly demanding property requirements. For example, RF power transistors used in wireless communications (e.g., in wireless basestation applications) may need to meet property requirements related to output power, linearity, gain and efficiency.

SUMMARY OF INVENTION

Gallium nitride material devices and methods associated with the same are provided.

In one aspect, a transistor is provided. The transistor comprises a gallium nitride material region. The transistor further comprises a source electrode formed, at least in part, over the gallium nitride material region; a gate electrode formed, at least in part, over the gallium nitride material region; and, a drain electrode formed, at least in part, over the gallium nitride material region. A source field plate comprising a conductive material is electrically connected to the source electrode.

In another aspect, a method is provided. The method comprises forming a gallium nitride material region. The method further comprises forming a source electrode, at least in part, over the gallium nitride material region; forming a gate electrode, at least in part, over the gallium nitride material region; and, forming a drain electrode, at least in part, over the gallium nitride material region. The method further comprises forming a source field plate comprising a conductive material that is electrically connected to the source electrode.

In another aspect, a method of operating a transistor is provided. The method comprises operating a transistor comprising gallium nitride material at a power density of at least 10 W/mm and a drain efficiency of at least 70%.

In another aspect, a method of operating a transistor is provided. The method comprises operating a transistor comprising gallium nitride material at a drain voltage of 28 V for a period of at least 1000 hours, while maintaining an output power that varies by less than 1 dB.

In another aspect, a method of operating a transistor is provided. The method comprises operating an RF transistor comprising a gallium nitride material formed over a silicon substrate with a gate-drain capacitance of less than 0.1 pF per mm of gale periphery.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

BRIEF DESCRIPTION OF THE DRAWINGS

FIG. 1D is a plan view of a power transistor according to one embodiment of the invention.

DETAILED DESCRIPTION OF THE INVENTION

The invention provides gallium nitride material devices and methods associated with the same. In some embodiments, the devices may be transistors which include a conductive structure connected to a source electrode. The conductive structure may form a source field plate which can be formed over a dielectric material and can extend in the direction of the gate electrode of the transistor. As described further below, the source field plate may reduce the electrical field (e.g., peak electrical field and/or integrated electrical field) in the region of the device between the gate electrode and the drain electrode which can lead to a number of advantages including reduced gate-drain feedback capacitance, reduced surface electron concentration, increased breakdown voltage, and improved device reliability. These advantages enable the gallium nitride material transistors to operate at high drain efficiencies and/or high output powers. The devices can be used in RF power applications, amongst others.

Figure 1A:
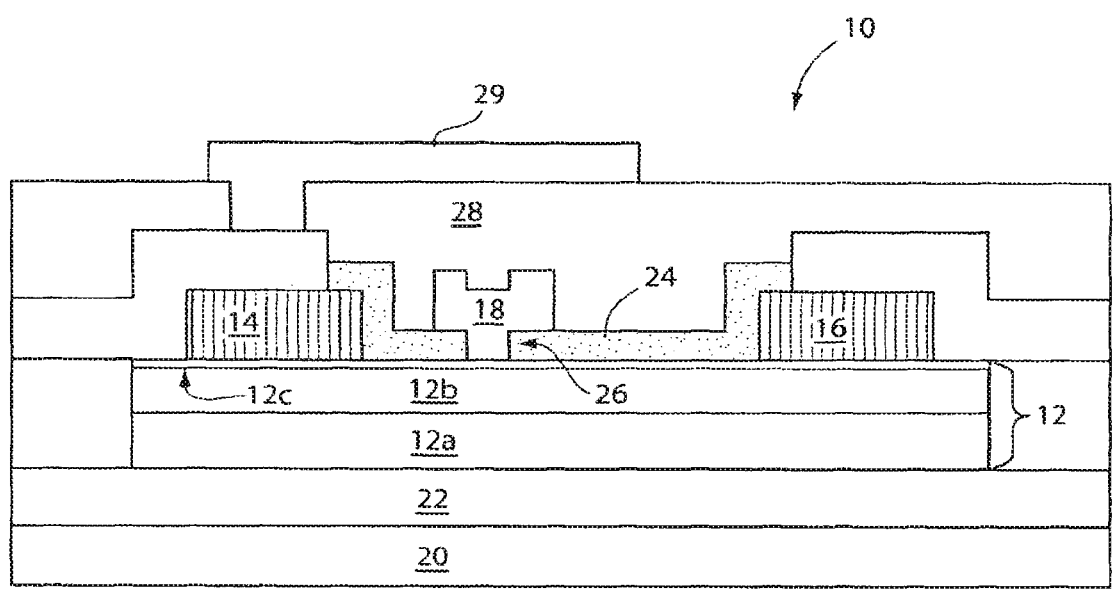
FIG. 1A is a cross-section of a gallium nitride material transistor building block structure according to one embodiment of the invention.
Figure 1B:
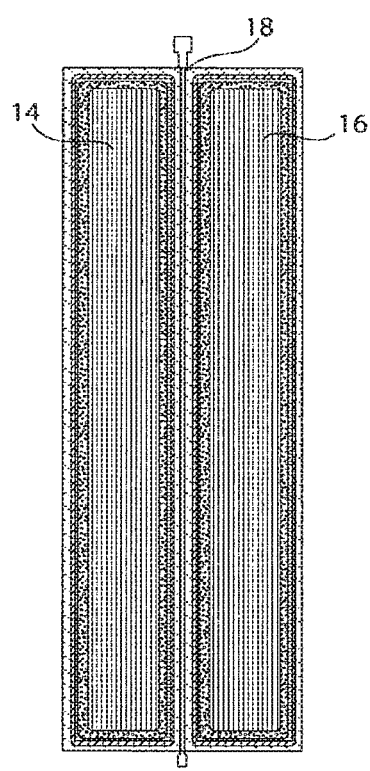
FIG. 1B is a top view of a transistor building block structure according to one embodiment of the invention.

FIGS. 1A and 1B respective illustrates a cross-section and top view of a transistor building block structure 10 according to one embodiment of the invention. Structure 10 includes a gallium nitride material region 12. In the illustrative embodiment, the transistor structure includes a source electrode 14 a drain electrode 16 and a gate electrode 18 formed on the gallium nitride material region. The gallium nitride material region is formed on a substrate 20 and, as shown, a transition layer may be formed between the substrate and the gallium nitride material region. The transistor includes a passivating layer 24 that protects and passivates the surface of the gallium nitride material region. In the illustrative embodiment a via 26 is formed within the passivating layer in which the gate electrode is in part formed. An encapsulation layer 28 is formed over the gate electrode and passivation layer, amongst other features. A source field plate 29 is formed, in part, on the encapsulation layer and is electrically connected to the source electrode. In the illustrative embodiment, the source field plate extends in a direction toward the gate electrode. As described further below, the presence of the source field plate can lead to a number of performance advantages.

When a structure (e.g., layer, region) is referred to as being "on", "over" or "overlying" another structure, it can be directly on the structure, or an intervening structure (e.g., layer, region) also may be present. A structure that is "directly on" or "in contact with" another structure means that no intervening structure is present. It should also be understood that when a structure is referred to as being "on", "over", "overlying", or "in contact with" another structure, it may cover the entire structure or a portion of the structure.

It should be understood that the transistor structure shown in FIG. 1A is illustrative of an embodiment of the invention but should not be considered limiting. Other transistor structures are also within the scope of the present invention including transistor structures with different layer(s), different layer arrangements and different features.

It should be understood that a plurality of building block structures 10 may be combined to construct a power transistor device, as described further below. Suitable ways of combining the building block structures are known to those of skill in the art and have been described in commonly-owned U.S. Patent Publication No. 2005-0167775 which is incorporated herein by reference and is based on U.S. patent application Ser. No. 10/913,297, filed Aug. 5, 2004; and U.S. Provisional. Patent Application No. 60/723,824, filed on Oct. 4, 2005 which is incorporated herein by reference.

Figure 1C:
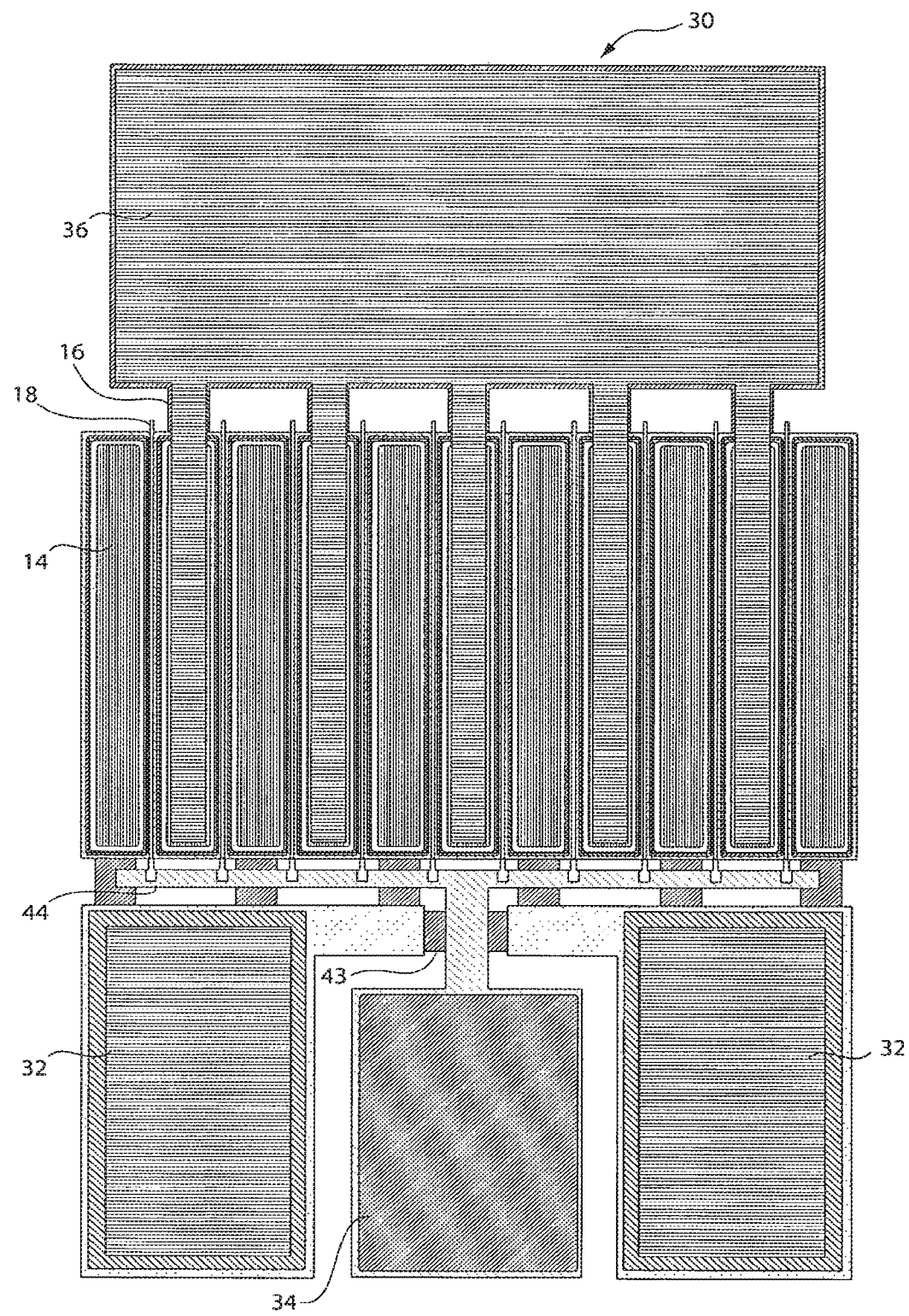
FIG. 1C is a plan view of a transistor unit cell according to one embodiment of the invention.

FIG. 1C is a plan view of a transistor unit cell 30 according to one embodiment of the invention. In this embodiment, the transistor unit cell includes ten transistor building block structures. As shown, the source electrodes in the unit cell are connected to a common source pad 32; the gate electrodes are connected to a common gate pad 34; and, the drain electrodes are connected to a common drain pad 36. In the illustrative unit cell, ten gate electrodes are connected to the gate pad, six source electrodes are connected to source pad, and five drain electrodes are connected to the gate pad.

It should be understood that, in other embodiments of the invention, the transistor unit cell may include a different number of building block structures and/or have different types of electrode and pad connections.

FIG. 1D is a plan view of a power transistor 40 according to one embodiment of the invention. The power transistor includes multiple transistor unit cells 30 arranged in parallel. In the illustrative embodiment, the transistor includes eighteen unit cells, though other numbers of unit cells are possible. Respective drain pads 36 from the unit cells are aligned to form a drain bus 42. Respective source pads 32 are connected to a source bus 43; and, respective gate pads 34 are connected to a gate bus 44.

In some embodiments, power transistor 40 is attached to a package to form a final packaged device. As described further below, other components (e.g., matching network components) may also be attached to the package. Bond wires may be used to make electrically connections between the components, the power transistor and the package (as needed). A single power transistor may be attached to a single package. However, it should also be understood that multiple power transistors may be attached to a single package.

The package may comprise suitable package material known in the art. In some embodiments, the package material is formed of a metal and/or a metal alloy. For example, the package may be formed of a copper/tungsten alloy coated with gold. In some cases, the package may comprise, at least in part, a ceramic material.

In some embodiments, transistors 40 may not be attached to a package. Instead, the transistors may be attached directly to a board, or to a heat sink. When attached to a board, other components may also be attached to the same board.

Transistors of the invention may operate in common source configuration. In this configuration, the source pads (and source electrodes) are connected to ground, the input signal from a source is received by the gate pads (and gate electrodes), and the output signal is transmitted from the drain pads (and drain electrodes) to a load driven by the transistor. However, it is possible, for the transistors to operate in other configurations.

The transistors may be connected to an impedance matching network which transforms impedance, amongst other functions. The impedance matching network may include an input matching network (e.g., formed between the input signal source and the gate pads) and an output matching network (e.g., formed between the drain pads and the load). The input matching network is designed to transform the input impedance of the transistor to a desired impedance (e.g., to a larger impedance to ease any subsequent external matching). The output matching network is designed to transform the output impedance of the transistor to a desired impedance (e.g., to a larger impedance to ease any subsequent external matching). For example, the transformed input and output impedance may be between 1 ohms and 50 ohms. Transistors of the present invention may advantageously have a high impedance for a given RF output power value which may enable use of matching networks having simple designs.

The matching network can comprise any component or feature capable of transforming impedance. Such components include devices (e.g., capacitors, inductors, resistors) that transform impedance by a known amount. Thus, the devices may be connected to form a network that transforms the impedance as desired.

Suitable capacitors that may be used in the matching network include conventional capacitor components. Suitable inductors include the bond wires. A number of variables associated with the bond wires (e.g., number, composition, dimensions, proximity to adjacent wires) may be selected to achieve the desired effect.

The components may be mounted to the same entity as the transistor(s) (e.g., package, heat sink or board). In some cases, the components may be separate from the mounted transistors. It may also be possible to form certain components (e.g., capacitors) directly on the same semiconductor substrate as the transistor.

It should be understood that the matching network may include other components or features that transform impedance. For example, dimensions of certain transistor features (e.g., source and gate contact pads) may transform impedance and, thus, may be considered part of the matching network. In some embodiments, the bond wires may be connected to the package, itself, which can make the package part of the matching network. The matching network may also include other components not described herein that transform impedance.

As noted above, the matching network is designed to transform impedance to a desired value. The matching network also may be designed to help achieve desired device performance. For example, the matching network may be designed to effect linearity (e.g., RCE values), efficiency, gain and output power (or power density). In general, the matching network can be designed by arranging the components and features in a manner that achieves the desired result. Typically, device simulation tools and experimentation can be used to test and optimize the design.

As described above, transistor structures include a source field plate 29. In general, the source field plate may be any suitable electrically conducting structure connected to the source electrode. The source field plate may be formed of any suitable conductive material including metals. In the illustrative embodiment, the source field plate extends laterally in the direction of the gate electrode and is connected to the source electrode via a vertically conductive pathway. It should be understood that other arrangements are possible.

The source field plate may have any suitable dimensions. In some embodiments, it is preferable that the source field plate extend over the gate electrode. This arrangement may be particularly well-suited for reducing the electrical field in the region of the device between the gate electrode and the drain electrode which can lead to certain performance advantages described herein. In some cases, it is preferred that the source field plate extend to a point between about 25% and 75% the distance between the gate and drain ($d_{gd}$); in some cases, it is preferred that the source field plate extend to a point between about 40% and 60% (e.g., about 50%) the distance between the gate and drain. The thickness of the source field plate may be between about 0.01 micron and about 10 micron; in some cases, the thickness may be between about 0.1 micron and about 1.0 micron (e.g., about 0.5 micron).

In some embodiments, it may be preferred that the source field plate be formed on a dielectric layer (e.g., $SiO_2$, $Si_3N_4$). As shown, the source field plate is formed on encapsulation layer 28, though it is also possible for the source field plate to be formed on a dielectric layer that does not function as an encapsulation layer. In some cases, the source field plate may be formed on passivating layer 24.

In some embodiments, the source field plate (and source electrode) may be connected to ground potential. Though, in other embodiments, the source field plate may be connected to a non-ground potential.

In certain embodiments, the source field plate may be electrically connected to a conductive region on the backside of the device, as described further below.

The presence of the source field plate may reduce the electrical field (e.g., peak electrical field and/or integrated electrical field) in the region of the device between the gate electrode and the drain electrode. This reduction can lead to a number of advantages including reduced gate-drain feedback capacitance, reduced surface electron concentration, increased breakdown voltage, and improved device reliability. These advantages enable the gallium nitride material transistors to operate at high drain efficiencies and/or high output powers.

Efficiency (i.e., drain efficiency) is defined as the output power divided by the product of drain current and drain voltage. Transistors of the invention may operate at efficiencies of greater than or equal to 25%. In some embodiments, the transistors operate at efficiencies of greater than or equal to 50% (e.g., between 70% and 90%); and, in some embodiments, the transistors operate at efficiencies of greater than or equal to 70% (e.g., between 70% and 90%).

Output power may be measured using standard techniques. It may be useful to express output power in terms of power density which is the output power divided by the gate periphery (W/exam). The output power depends largely on the size of the transistor. In some cases, for example when the device has a gate periphery of 36 mm, the output power is greater than or equal to 180 W (e.g., between about 180 W and about 500 W); and/or greater than or equal to 220 W; and/or greater than or equal to 350 W. Transistors of the invention may have power densities of greater than or equal to 5 W/mm. In some embodiments, the power density may be greater than or equal to 7 W/mm; and, in some embodiments, the power density may be greater than or equal to 10 W/mm. Transistors of the invention may operate at these power densities with the above-noted efficiency values.

Transistors of the invention may also operate at sufficient gains for RF power transistors markets (including wideband applications). Gain is defined as the output power divided by the input power and may be expressed in units of dB. Transistors of the invention may have a gain of greater than or equal to 5 dB. In some embodiments, the gain may be greater than or equal to 12 dB (e.g., between 12 and 15). In some embodiments, the gain may be greater than or equal to 20 dB.

In some cases, the transistors are operated at drain voltages of up to 300 Volts. In some cases, the drain voltage may be less than or equal to 100 Volts or may be less than or equal to 60 Volts (e.g., 12 Volts, 28 Volts, 48 Volts and 60 Volts). It should be understood that transistors of the invention may achieve the above-noted efficiency and power density values at these drain voltages (e.g., 60 Volts). Suitable gate voltages may be between 0 Volts and −10 Volts.

The transistors of the invention may be operated in frequency ranges between about 500 MHz and about 28 GHz; and, in some cases, within a frequency range of between about 2 and about 6 GHz (e.g., 3.3-3.6 GHz).

The properties noted above enable transistors of the invention to be used in RF power applications. In particular, the transistors may be suitable for wideband power applications (e.g., WiMAX, WiBro, and others) based on OFDM modulation. However, it should be understood, that devices of the invention may be used in other applications.

Referring again to FIG. 1A, gallium nitride material region 12 of the transistor structure functions as the active region. That is, the conductive channel extending from the source electrode to the drain electrode is formed in the gallium nitride material region. The gallium nitride material region comprises at least one gallium nitride material layer. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_x In_y Ga_{(1-x-y)}N$), gallium arsenide phosporide nitride ($GaAs_aP_b N_{(1-a-b)}$), aluminum indium gallium arsenide phosporide nitride ($Al_x In_y Ga_{(1-x-y)} As_a P_b N_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x±y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic. Suitable gallium nitride materials have been described in commonly-owned U.S. Pat. No. 6,649,287 incorporated herein by reference.

In some cases, the gallium nitride material region includes only one gallium nitride material layer. In other cases, the gallium nitride material region includes more than one gallium nitride material layer. For example, the gallium nitride material region may include multiple layers (12a, 12b, 12c), as shown. In certain embodiments, it may be preferable for the gallium nitride material of layer 12b to have an aluminum concentration that is greater than the aluminum concentration of the gallium nitride material of layer 12a. For example, the value of x in the gallium nitride material of layer 12b (with reference to any of the gallium nitride materials described above) may have a value that is between 0.05 and 1.0 greater than the value of x in the gallium nitride material of layer 12a, or between 0.05 and 0.5 greater than the value of x in the gallium nitride material of layer 12a. For example, layer 12b may be formed of $Al_{0.26}Ga_{0.74}N$, while layer 12a is formed of GaN. This difference in aluminum concentration may lead to formation of a highly conductive region at the interface of the layers 12a, 12b (i.e., a 2-D electron gas region). In the illustrative embodiment, layer 12c may be formed of GaN.

Gallium nitride material region 12 also may include one or more layers that do not have a gallium nitride material composition such as other III-V compounds or alloys, oxide layers, and metallic layers.

The gallium nitride material region is of high enough quality so as to permit the formation of devices therein. Preferably, the gallium nitride material region has a low crack level and a low defect level. As described further below, transition layer 22 (particularly when compositionally-graded) may reduce crack and/or defect formation. Gallium nitride materials having low crack levels have been described in U.S. Pat. No. 6,649,287 incorporated by reference above. In some cases, the gallium nitride material region a crack level of less than 0.005 $\mu m/\mu m^2$. In some cases, the gallium nitride material region has a very low crack level of less than 0.001 $\mu m/\mu m^2$. In certain cases, it may be preferable for gallium nitride material region to be substantially crack-free as defined by a crack level of less than 0.0001 $\mu m/\mu m^2$.

In some embodiments, gallium nitride materials having low dislocation densities may be preferred. Suitable gallium nitride materials and processes for forming the same are described in commonly-owned, co-pending U.S. patent application Ser. No. 10/886,506, filed Jul. 7, 2004, entitled "III-Nitride Materials Including Low Dislocation Densities and Methods Associated With the Same".

In certain cases, the gallium nitride material region includes a layer or layers which have a monocrystalline structure. In some cases, the gallium nitride material region includes one or more layers having a Wurtzite (hexagonal) structure.

The thickness of the gallium nitride material region and the number of different layers are dictated, at least in part, by the requirements of the specific device. At a minimum, the thickness of the gallium nitride material region is sufficient to permit formation of the desired structure or device. The gallium nitride material region generally has a thickness of greater than 0.1 micron, though not always. In other cases, gallium nitride material region 12 has a thickness of greater than 0.5 micron, greater than 0.75 micron, greater than 1.0 microns, greater than 2.0 microns, or even greater than 5.0 microns.

As noted above, the device includes passivating layer 24 formed on the surface of gallium nitride material region 12. Suitable passivating layers (some of which also function as electrode-defining layers) have been described in commonly-owned U.S. Patent Publication No. 2005-0133818 which is incorporated herein by reference and is based on U.S. patent application Ser. No. 10/740,376, filed Dec. 17, 2003, entitled "Gallium Nitride Material Devices Including an Electrode-Defining Layer and Methods of Forming The Same".

Suitable compositions for passivating layer 24 include, but are not limited to, nitride-based compounds (e.g., silicon nitride compounds), oxide-based compounds (e.g., silicon oxide compounds), polyimides, other dielectric materials, or combinations of these compositions (e.g., silicon oxide and silicon nitride). In some cases, it may be preferable for the passivating layer to be a silicon nitride compound (e.g., $Si_3N_4$) or non-stoichiometric silicon nitride compounds.

In certain preferred embodiments, substrate 20 is a silicon substrate. Silicon substrates may be preferred because they are readily available, relatively inexpensive and are of high crystalline quality.

As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used. In some cases, silicon (111) substrates are preferred. In other cases, silicon (100) substrates are preferred.

It should be understood that other types of substrates may also be used including sapphire, silicon carbide, indium phosphide, silicon germanium, gallium arsenide, gallium nitride material, aluminum nitride, or other III-V compound substrates. However, in embodiments that do not use silicon substrates, all of the advantages associated with silicon substrates may not be achieved.

It should also be understood that though the illustrative embodiments include a substrate, other embodiments of the invention may not have a substrate. In these embodiments, the substrate may be removed during processing. In other embodiments, the substrate may also function as the gallium nitride material region. That is, the substrate and gallium nitride material region are the same region.

Substrate 20 may have any suitable dimensions and its particular dimensions are dictated, in part, by the application and the substrate type. Suitable diameters may include, but are not limited to, about 2 inches (50 mm), 4 inches (100 mm), 6 inches (150 mm), and 8 inches (200 mm).

In some cases, it may be preferable for the substrate to be relatively thick, such as greater than about 125 micron (e.g., between about 125 micron and about 800 micron, or between about 400 micron and 800 micron). Relatively thick substrates may be easy to obtain, process, and can resist bending which can occur, in some cases, when using thinner substrates. In other embodiments, thinner substrates (e.g., less than 125 microns) are used. Though thinner substrates may not have the advantages associated with thicker substrates, thinner substrates can have other advantages including facilitating processing and/or reducing the number of processing steps. In some processes, the substrate initially is relatively thick (e.g., between about 200 microns and 800 microns) and then is thinned during a later processing step (e.g., to less than 150 microns).

In some preferred embodiments, the substrate is substantially planar in the final device or structure. Substantially planar substrates may be distinguished from substrates that are textured and/or have trenches formed therein (e.g., as in U.S. Pat. No. 6,265,289). In the illustrative embodiments, the regions/layers formed on the substrate (e.g., transition layer, gallium nitride material region, and the like) may also be substantially planar. As described further below, such regions/layers may be grown in vertical (e.g., non-lateral) growth processes. Planar substrates and regions/layers can be advantageous in some embodiments, for example, to simplify processing. Though it should be understood that, in some embodiments of the invention, lateral growth processes may be used as described further below.

Transition layer 22 may be formed on substrate 20 prior to the deposition of gallium nitride material region 12. The transition layer may accomplish one or more of the following: reducing crack formation in the gallium nitride material region 12 by lowering thermal stresses arising from differences between the thermal expansion rates of gallium nitride materials and the substrate; reducing defect formation in gallium nitride material region by lowering lattice stresses arising from differences between the lattice constants of gallium nitride materials and the substrate; and, increasing conduction between the substrate and gallium nitride material region by reducing differences between the band gaps of substrate and gallium nitride materials. The presence of the transition layer may be particularly preferred when utilizing silicon substrates because of the large differences in thermal expansion rates and lattice constant between gallium nitride materials and silicon. It should be understood that the transition layer also may be formed between the substrate and gallium nitride material region for a variety of other reasons. In some cases, for example when a silicon substrate is not used, the device may not include a transition layer.

The composition of transition layer 22 depends, at least in part, on the type of substrate and the composition of gallium nitride material region 12. In some embodiments which utilize a silicon substrate, the transition layer may preferably comprise a compositionally-graded transition layer having a composition that is varied across at least a portion of the layer. Suitable compositionally-graded transition layers, for example, have been described in commonly-owned U.S. Pat. No. 6,649,287, entitled "Gallium Nitride Materials and Methods," filed on. Dec. 14, 2000, which is incorporated herein by reference. Compositionally-graded transition layers are particularly effective in reducing crack formation in the gallium nitride material region by lowering thermal stresses that result from differences in thermal expansion rates between the gallium nitride material and the substrate (e.g., silicon). In some embodiments, when the compositionally-graded, transition layer is formed of an alloy of gallium nitride such as $Al_xIn_yGa_{(1-x-y)}N$, $Al_xGa_{(1-x)}N$, or $In_yGa_{(1-y)}N$, wherein $0 \le x \le 1$, $0 \le y \le 1$. In these embodiments, the concentration of at least one of the elements (e.g., Ga, Al, In) of the alloy is typically varied across at least a portion of the cross-sectional thickness of the layer. For example; when the transition layer has an $Al_xIn_yGa_{(1-x-y)}N$ composition, x and/or y may be varied; when the transition layer has a $Al_xGa_{(1-x)}N$ composition, x may be varied; and, when the transition layer has a $In_yGa_{(1-y)}N$ composition, y may be varied.

In certain preferred embodiments, it is desirable for the transition layer to have a low gallium concentration at a back surface which is graded to a high gallium concentration at a front surface. It has been found that such transition layers are particularly effective in relieving internal stresses within the gallium nitride material region. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer). The composition of the transition layer, for example, may be graded discontinuously (e.g., step-wise) or continuously. One discontinuous grade may include steps of AlN, $Al_{0.6}Ga_{0.4}N$ and $Al_{0.3}Ga_{0.7}N$ proceeding in a direction toward the gallium nitride material region.

In some cases, the transition layer has a monocrystalline structure.

It should be understood that, in some embodiments, transition layer 22 has a constant (i.e., non-varying) composition across its thickness.

The source, drain and gate electrodes may be formed of any suitable conductive material such as metals (e.g., Au, Ni, Pt), metal compounds (e.g., WSi, WSiN), alloys, semiconductors, polysilicon, nitrides, or combinations of these materials. In particular, the dimensions of the gate electrode can be important to device performance. In the illustrative embodiment, via 26 formed in the passivating layer defines (at least in part) the gate electrode dimensions. Thus, by controlling the shape of the via, it is possible to define desired gate dimensions. Suitable via dimensions have been described in U.S. Patent Publication No. 2005-0133818, incorporated by reference above.

In some embodiments, it may be preferable that the gate electrode extends over a portion of the top surface of the passivating layer a distance in a direction of the drain electrode greater than a distance in a direction of the source electrode. For example, it may be advantageous to control the source electrode side overhang distance to be less than drain electrode side overhang distance as described in U.S. Patent Publication No. 2005-0133818, incorporated by reference above. In some cases, it is preferable to have source electrode side overhang distance be less than 50 percent of drain electrode side overhang distance, or even less than 20% of drain electrode side overhang distance.

Reducing the value of source electrode side overhang distance limits, or prevents, unwanted gate-source capacitance. These arrangements may be particularly effective in combination with the source field plate. Suitable gate electrode dimensions have been described in U.S. Patent Publication No. 2005-0133818, incorporated by reference above.

In some embodiments, electrodes may extend into the gallium nitride material region. For example, electrode material (e.g., metal) deposited on the surface of the gallium nitride material region may diffuse into the gallium nitride material region during a subsequent annealing step (e.g., RTA) when forming the electrode. In particular, the source and drain electrodes may include such a portion diffused into the gallium nitride material region. As used herein, such electrodes are still considered to be formed on the gallium nitride material region.

Source, gate and drain pads may be formed of any suitable conductive material such as metals (e.g., Au, Ni, Pt), metal compounds (e.g., WSi, WSiN), alloys, semiconductors, polysilicon, nitrides, or combinations of these materials. In some embodiments, the pads are formed of the same material as the corresponding electrodes.

In some embodiments, electrodes/pads may be directly connected to a power source, for example, by wire bonding or air bridging. In other embodiments, electrodes/pads may be indirectly connected to a power source, for example, by a conductive pathway which connects to another electrode/pad (or contact) and then to the power source.

The device shown in FIG. 1A also includes an encapsulation layer 28 which, as known to those of skill in the art, encapsulates underlying layers of the structure to provide chemical and/or electrical protection. The encapsulation layer may be formed of any suitable material including oxides or nitrides.

It should be understood that the transistor structure may include other layers. For example, the transistor structure may include additional features not shown in FIG. 1A. For example, the transistor structure may include a strain-absorbing layer formed directly on the surface of substrate 20. Suitable strain-absorbing layers have been described in commonly-owned, co-pending U.S. patent application Ser. No. 10/879,703, entitled "Gallium Nitride Materials and Methods Associated With the Same", filed Jun. 28, 2004, which is incorporated herein by reference. In one embodiment, it may be preferable for the strain-absorbing layer to be very thin (e.g., thickness of between about 10 Angstroms and about 100 Angstroms) and formed of an amorphous silicon nitride-based material.

In some embodiments, other layers (e.g., intermediate layers) may be present. Suitable intermediate layers, for example, have been described and illustrated in U.S. Pat. No. 6,649,287, which was incorporated by reference above. In other embodiments of the invention, layer(s) shown herein may not be present. Other variations to the structures and devices shown herein would be known to those of skill in the art and are encompassed by the present invention.

As noted above, the source field plate may be electrically connected to a conductive region (e.g., contact) on the backside of the device. For example, such connection may be made through a conductive pathway that extends from the source electrode to the backside as shown schematically in FIG. 16. However, it should be understood that the source field plate is not connected to a conductive region at the backside of the device in all embodiments of the invention and that the invention is not limited is not regard.

Figure 16:
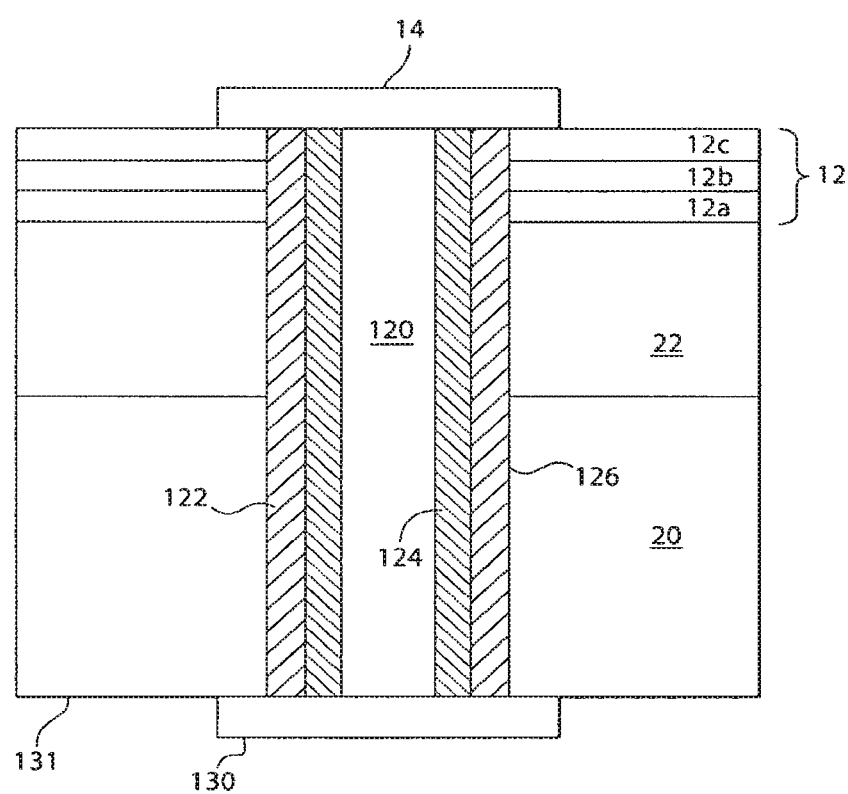
FIG. 16 shows a portion of a gallium nitride material transistor including a conductive pathway that extends from the source electrode to the backside of the device according to one embodiment of the invention.

In the embodiment of FIG. 16, the device includes an electrically conductive material layer 124 formed in a via 120. The electrically conductive material layer provides a conductive pathway associated with the structure. For example, the electrically conductive material layer connects the source electrode and source plate to a contact 130 on a backside 131, as shown. In this embodiment, a barrier material layer 122 is formed on sidewalls 126 of the via to separate the electrically conductive material from the substrate thereby limiting undesirable reactions between the electrically conductive material and the substrate which may otherwise occur, for example, at elevated temperatures in subsequent processes. However, it should be understood that this barrier layer is optional in certain embodiments of the invention and need not be present.

Electrically conductive material layer 124 may formed of any material having suitable electrical conductivity. In certain embodiments, it may be preferable for the electrically conductive material layer to comprise gold. When comprised of gold, the electrically conductive material layer may also comprise other elements such as metals (e.g., copper). The other element(s) may be alloyed with gold to form a layer having a single composition. Also, the other element(s) may be present in a separate layer formed on top of a gold layer, both of which are combined to form the electrically conductive material layer. That is, the electrically conductive material layer can be formed of two (or more) conductive layers having different compositions; or, may be formed of a layer having a single composition. In cases where other metal elements are present in the layer, gold may be the major component of the layer (e.g., greater than 50% by weight, greater than 75% by weight, or greater the 90% by weight). Other suitable metal elements include titanium, tin, nickel, aluminum, and copper, amongst others. Any alloy combinations of these metals (including gold) may be suitable. In certain embodiments, the layer may consist essentially of gold, meaning that other elements are present (if at all) in amounts that do not materially effect the properties of the layer. As described further below, it may be advantageous for the electrically conductive material layer to be formed of a similar composition as that of one or more electrical contacts (e.g., source contact, backside contact) to which the electrically conductive material layer is connected.

The electrically conductive material layer is generally sufficiently thick to ensure suitable conduction. For example, the electrically conductive material layer may have a thickness between about 100 nm and about 10 micron, though it should be understood that other thicknesses are also possible. Different portions of the layer may have different thicknesses.

In the embodiment of FIG. 16, the electrically conductive material layer is formed on sidewalls of the via (with the barrier material layer functioning as an intervening layer between the electrically conductive material layer and the sidewall, as described further below). The electrically conductive material layer may be deposited using known techniques including sputtering, evaporative and plating techniques. As shown, the electrically conductive material layer covers substantially the entire surface area of the via sidewalls. In other embodiments, the electrically conductive material layer may cover only a portion of the surface area of the via sidewalls (e.g., greater than 50 percent or greater than 75 percent of the sidewall surface area). In some embodiments, the electrically conductive material layer further extends from the via sidewall onto other portions of the structure. For example, the electrically conductive material layer may extend onto the topside and/or backside of the device.

In FIG. 16, barrier material layer 22 is positioned so as to separate the electrically conductive material from certain other regions of the structure. The barrier material layer generally is formed of material suitable for preventing undesired reactions (e.g., chemical reactions) between the electrically conductive material and other regions of the structure. For example, the barrier material may prevent undesired chemical reaction between the electrically conductive material and the substrate, particularly when the electrically conductive material is formed of gold and the substrate is a silicon substrate. It should also be understood that the barrier material may also provide other functions such as electrically isolating the electrically conductive material from other regions of the structure. When providing electrical isolation, the barrier material is suitably insulating. In other cases, the barrier material may also be formed of an electrically conductive material and, at least part of, the barrier material layer may form part of a conductive pathway with the electrically conductive material layer. It should be understood that certain embodiments of the invention do not include a barrier layer.

Suitable compositions for the barrier layer may include one or more of the following metals titanium, tungsten, nickel and platinum. When the barrier layer comprises more than one metal, the metals may be alloyed to form a single composition; or, may be formed as a series of layers having different compositions which combine to form the barrier layer. In some embodiments, it may be preferred that the barrier layer comprises a titanium-tungsten alloy. When electrically insulating, the barrier material may be formed of silicon oxide or silicon nitride, amongst other insulators.

In the illustrative embodiment, the barrier material layer is formed across the entire area between the substrate and the electrically conductive material layer. That is, the barrier material layer separates the substrate (e.g., silicon substrate) and the electrically conductive material layer at all locations with the barrier material layer being directly on the sidewalls of the via and the electrically conductive material layer being directly on the barrier material layer. This arrangement may be preferred to prevent/limit interaction between the substrate and the electrically conductive material.

The device of FIG. 16 includes backside contact 130. A contact may be to any suitable conducting structure on a semiconductor device that is designed to be connected to a power source. "Contacts" may also be referred to as electrodes, terminals, contact pads, contact areas, contact regions and the like. In some embodiments, contacts may be directly connected to a power source, for example, by wire bonding or air bridging. In other embodiments, a contact may be indirectly connected to a power source, for example, by a conductive pathway which connects to another contact and then to the power source.

Backside contact is formed of conducting materials including certain metals. Any suitable conducting material known in the art may be used. In some embodiments, it may be preferred for at least one of the backside contact and/or source electrode to be formed of the same material as the conductive pathway. For example, it may be preferable for the contact(s) to comprise gold. Gold may be the major component of the layer (e.g., greater than 50% by weight, greater than 75% by weight, or greater the 90% by weight). In certain embodiments, the layer may consist essentially of gold, meaning that other elements are present (if at all) in amounts that do not materially effect the properties of the layer.

The backside contact may also be formed of other suitable metals including titanium, nickel, aluminum, and copper, amongst others. Any alloy combinations of these metals (including gold) may be suitable. In some embodiments, the composition of the contact may depend upon the type of material that the contact is formed on. Suitable metals for n-type contacts include titanium, nickel, aluminum, gold, copper, and alloys thereof. Suitable metals for p-type contacts include nickel, gold, and titanium, and alloys thereof.

The backside contact generally have a thickness sufficient to ensure that the contact is electrically conductive across its entire physical area. Suitable thicknesses for contacts, for example, are between about 0.05 microns and about 10 microns.

Via 120 can enable formation of a conductive pathway within the structure when electrically conductive material is deposited therein. As shown, the via can connect the source electrode to the backside contact which can lead to greater flexibility in device design, amongst other advantages.

The via may be formed in any suitable shape. The cross-sectional area of the via is generally sufficient to enable formation of the desired structure (e.g., electrically conductive material layer, barrier material layer) therein. The cross-sectional profile of the via may be square, rectangular, spherical, triangular, or the like. The via may have the same cross-sectional profile throughout the via, or may have a cross-sectional area which changes (e.g., increases, decreases) at any point along the depths of the via. For example, in one embodiment, the via may have a cross-sectional profile which progressively narrows as the depth of the via increases. In some embodiments, a first portion of the via has a relatively large cross-sectional area and a second portion of the via has a smaller cross-sectional area. The first portion may extend from a topside of the structure and is formed in a first etching step; and, the second portion may extend from a backside of the structure and is formed of a second etching step.

The via may extend from different sides of the structure and to a variety of depths in the structure based on the application. The via may extend from the topside and/or backside. In some cases, the via extends through the entire structure (e.g., as shown in FIG. 16) and, thus, from both the topside and backside. However, it is also possible for the via to extend from only one of the topside or backside and through only a portion of the structure. For example, the via may extend from the topside to the silicon substrate (particularly, if the silicon substrate is sufficiently conductive and may be grounded). Also, the via may extend from the backside through the silicon substrate to a point within the gallium nitride material region. Other via arrangements are also possible.

In the illustrative embodiment, a portion of the via remains unfilled with material. However, in other cases, the via may be completely filled with material. Also, it should be understood that other layers (in addition to the barrier material layer and the electrically conductive material layer) may be formed in the via.

It should be understood that the electrically conductive material layers and/or the barrier material layers described above may be formed within a portion, or the entire via, in any via arrangement.

Structures and devices of the present invention may be formed using methods that employ conventional processing techniques. In general the stack of material layers is formed on a substrate which is later processed (e.g., diced) to form the desired final structure (e.g., transistor).

For example, the layers and regions of the transistor structure of FIG. 1A may be formed, patterned, etched and implanted using conventional techniques.

Transition layer 22 and gallium nitride material region 12 may be deposited, for example, using metal organic chemical vapor deposition (MOCVD), molecular beam epitaxy (MBE), and hydride vapor phase epitaxy (HYPE), amongst other techniques. The preferred technique may depend, in part, on the composition of the layers. An MOCVD process may be preferred. A suitable MOCVD process to form a transition layer (e.g., a compositionally-graded transition layer) and gallium nitride material region over a silicon substrate has been described in U.S. Pat. No. 6,649,287 incorporated by reference above. When the semiconductor material region has different layers, in some cases it is preferable to use a single deposition step (e.g., an MOCVD step) to form the entire gallium nitride material region. When using the single deposition step, the processing parameters are suitably changed at the appropriate time to form the different layers. In certain preferred cases, a single growth step may be used to form the transition layer and the gallium nitride material region.

When present, the stress-absorbing layer may be formed using techniques described in U.S. patent application Ser. No. 10/879,703 which is incorporated by reference above.

Passivating layer 24 may be deposited using any suitable technique. The technique used, in part, depends on the composition of the passivating layer. Suitable techniques include, but are not limited to CVD, PECVD, LP-CVD, ECR-CVD, ICP-CVD, evaporation and sputtering. When the passivating layer is formed of a silicon nitride material, it may be preferable to use PECVD to deposit the layer.

When present, via 26 may be formed within the passivating layer using an etching technique. A plasma etching technique is preferably used to form the via with controlled dimensions Source, drain and gate electrodes may be deposited on the gallium nitride material region using known techniques such as an evaporation technique. In cases when the electrodes include two metals, then the metals are typically deposited in successive steps. The deposited metal layer may be patterned using conventional methods to form the electrodes. In some embodiments, an annealing step (e.g., RTA) may also be used in which the deposited electrode material diffuses into the gallium nitride material region, particularly when forming source and drain electrodes.

Suitable techniques for forming the passivating layer, via and electrodes have been described in U.S. Patent Publication No. 2005-0133818, which is incorporated herein by reference above.

Source, drain and gate electrode pads may also be deposited and patterned using known techniques. The source field plate may also be deposited and patterned using known techniques.

In some embodiments, an isolation region may be formed which electrical isolates the active region. Suitable processes for forming isolation region have been described in commonly owned, co-pending U.S. patent application Ser. No. 10/879,795, filed Jun. 28, 2004, entitled "Gallium Nitride Material Structures Including Isolation Regions and Methods", which is incorporated herein by reference above.

The above-described processes are used to form a semiconductor wafer including the desired material layers and features. The wafer may be further processed using conventional techniques to produced the desired structure. In some methods, the wafer may be thinned from its backside. A metallic layer (e.g., gold) may then be deposited on the backside. The wafer may be diced to form transistors (e.g., die) which can be further processed. When mounting on a package, the transistor may be placed in the package and subjected to a heating step sufficient to weld the transistor to the packaging material. In other embodiments, the transistors are mounted to other entities (e.g., a heat sink) using known techniques.

The following example is not limiting and are presented for purposes of illustration.

Example 1

This example describes production and characterization of gallium nitride material transistors having a source field plate, as well as comparison to gallium nitride material transistors without a source field plate.

Figure 2:
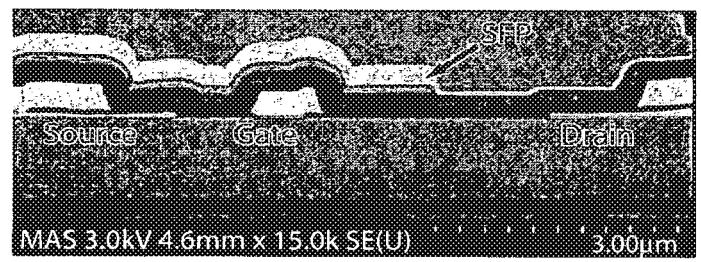
FIG. 2 is a cross-section of a gallium nitride material transistor including a source field plate as described in Example 1.
Figure 3:
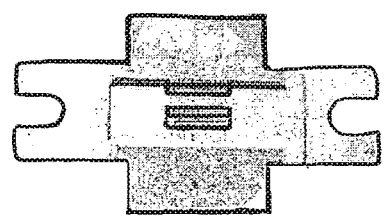
FIG. 3 shows a gallium nitride material transistor die as described in Example 1.

Gallium nitride material regions including an undoped $Al_{0.26}Ga_{0.74}$ layer formed on a GaN layer were grown on high resistivity Si (111) substrates by metal organic chemical vapor deposition (MOCVD). The structures included a compositionally-graded AlGaN transition layer formed between the substrate and the gallium nitride material region. The aluminum concentration in the transition layer decreased in a step-wise manner in a direction from the substrate to the gallium nitride material region. The structures were further processed to produce HFET devices having a similar layer structure as the device shown in FIG. 1A. The devices had a gate length of 0.7 μm, gate-to-source spacing of 1 μm, and gate-to-drain spacing of 3 μm. The single chip transistors had a total gate periphery of 36 mm and unit gate width of 200 μm. Some of the devices fabricated included a field plate connected to the source and extending to the center of the gate-drain region. Other devices did not include a source field plate. FIG. 2 shows a SEM cross section of a representative device including a source field plate. FIG. 3 shows a packaged device. The 6 mil thick die were packaged using a Au—Si eutectic die attach in industry standard CuW RF packages with a two-stage input match and no output match.

Figure 4:
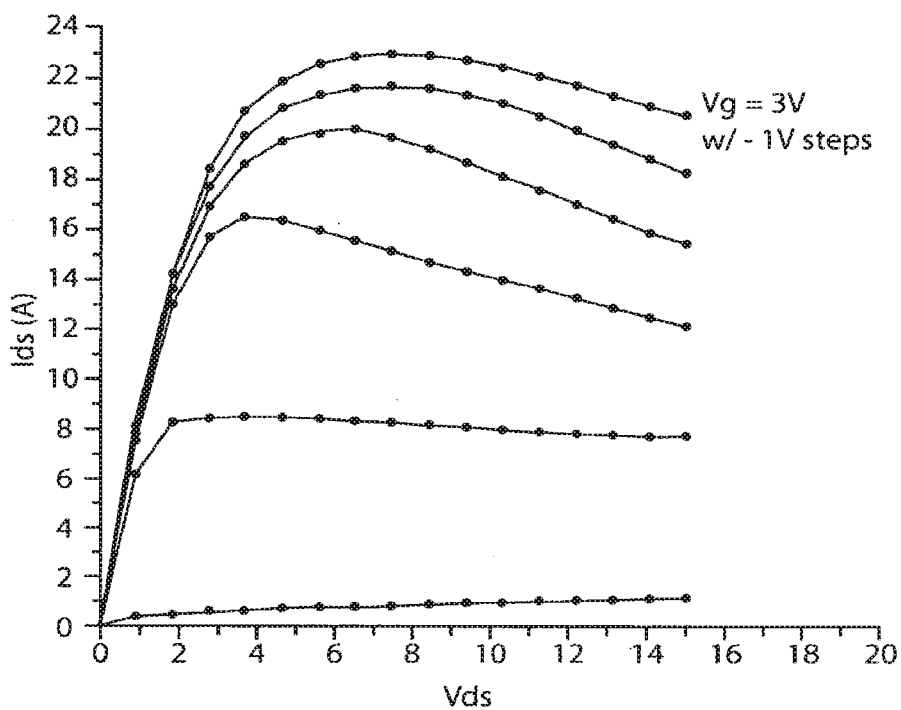
FIG. 4 is an I-V curve for a gallium nitride material transistor as described in Example 1.
Figure 5:
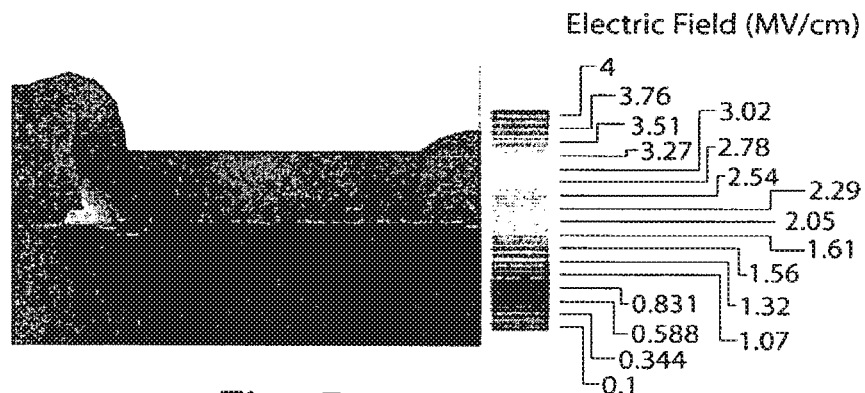
FIG. 5 is a simulation of electric fields in the gate drain region for a gallium nitride material transistor without a source field plate under conditions $V_{gs}=-2.0$ V, $V_{ds}=45$ V as described in Example 1.
Figure 6:
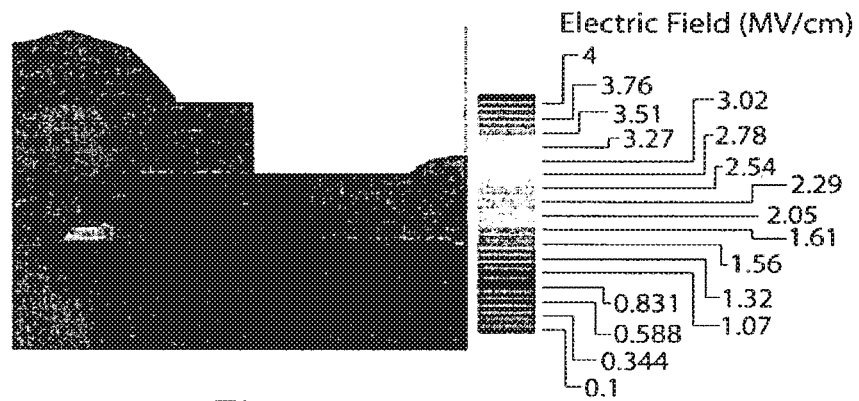
FIG. 6 is a simulation of electric fields in the gate drain region for a gallium nitride material transistor without a source field plate under conditions $V_{gs}=-2.0$ V, $V_{ds}=45$ V as described in Example 1.
Figure 7:
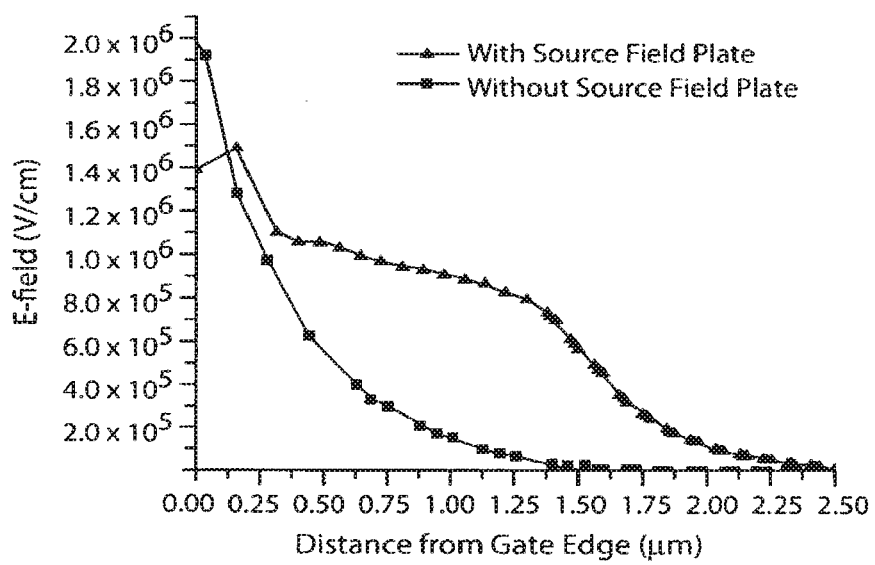
FIG. 7 is a graph of simulated values of the peak electric fields for a gallium nitride material transistor with and without the source field plate under conditions $V_{gs}=-2.0$ V, $V_{ds}=45$ V as described in Example 1.
Figure 8:
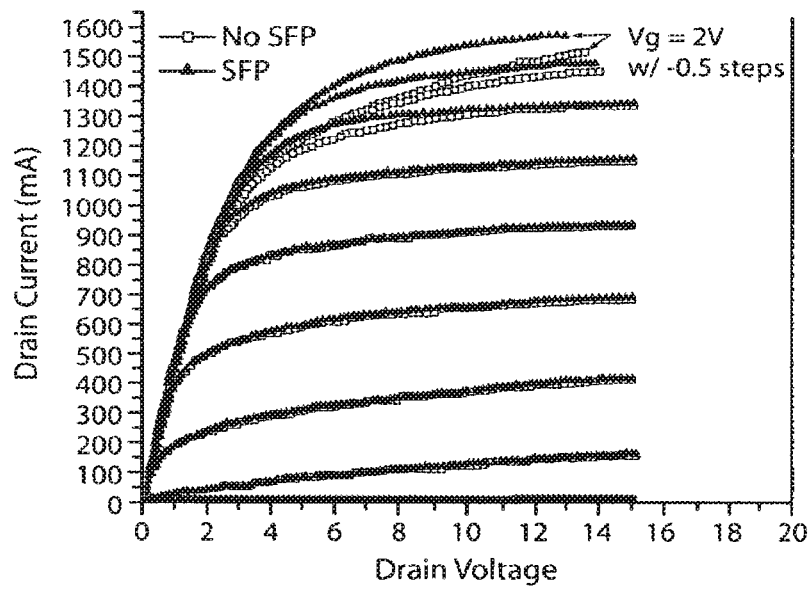
FIG. 8 is a graph of pulsed I-V measurements for a gallium nitride material transistor with and without the source field plate in which the transistors were pulsed from $V_d=50$ V and $V_g=-5$ V as described in Example 1.

FIG. 4 shows the I-V characteristics of a 36 mm periphery device exhibiting a maximum drain current ($I_{max}$) of ~640 mA/mm, a pinch-off voltage ($V_p$) of ~−2.2 V and a maximum transconductance ($g_{max}$) of ~220 mS/mm. The three terminal breakdown, defined as 1 mA/mm of total leakage for a pinched off device is >120V. 2-D device simulations were performed on structures with and without the SFP. Simulations performed with $V_{gs}$=−2 V and $V_{ds}$=45 V show the redistribution of the electric field produces a reduction in the peak electric field experienced in the gate drain region (FIGS. 5-7). Pulsed IV measurements were also performed using an Accent D265 on 2 mm periphery devices with and without the source field plate. This 2 mm device is the unit power cell for a 36 mm periphery device described earlier and is connected to CPW probing pads. The devices were pulsed from the off state (Vg=−5V) and a drain bias of 50V. FIG. 8 shows the difference in the output characteristics of the two devices. The most significant differences occur as the transistor is approaching maximum drain current conditions and may be the result of a dispersion phenomenon which is prominent in the devices without the source field plate.

Figure 9:
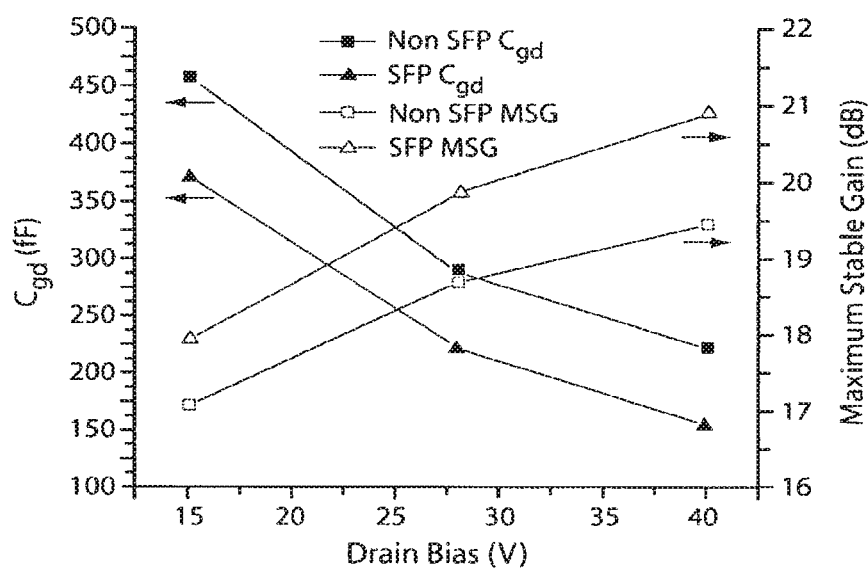
FIG. 9 is a graph that compares $C_{gd}$ and MSG versus drain bias at 2.14 GHz for a gallium nitride material transistor with and without a source field plate as described in Example 1.

Small signal characteristics for the 2 mm wide CPW HFETs with and without source field plates were obtained by on-wafer S-parameter measurements from 100 MHz-26 GHz using an Agilent 8510C VNA. The VNA was calibrated to the reference plane at CPW probes using S-O-L-T calibration standards. Values for the parasitic elements for the equivalent circuit were extracted using the Dambrine method. FIG. 9 demonstrates the reduction in the gate-drain capacitance ($C_{gd}$) delivered by the SFP and how $C_{gd}$ trends lower with increasing drain voltage for both designs. The second set of curves in FIG. 9 shows the improvement in gain that the reduction in the feedback capacitance delivers.

Figure 10:
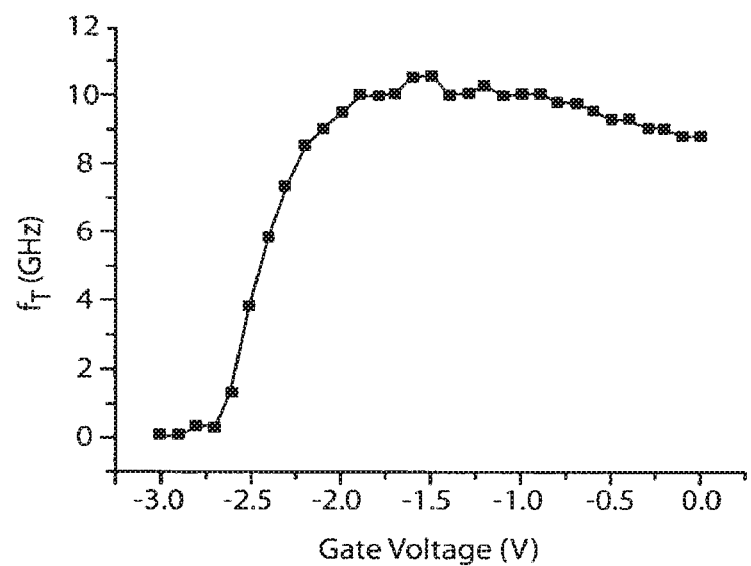
FIG. 10 is a graph of $f_T$ vs. $V_g$ at $V_d=28$ V for a 0.7 micron gallium nitride material transistor with a source field plate as described in Example 1.

FIG. 10 shows the $f_T$ performance versus gate bias for a 2 min device with a source field plate operating at a drain bias of 28 V. At an $I_{DQ}$ of 27.5 mA/mm, the typical current density used for linear operation, the $f_T$ is ~7 GHz and the maximum $f_T$ is ~10.6 GHz.

Figure 11:
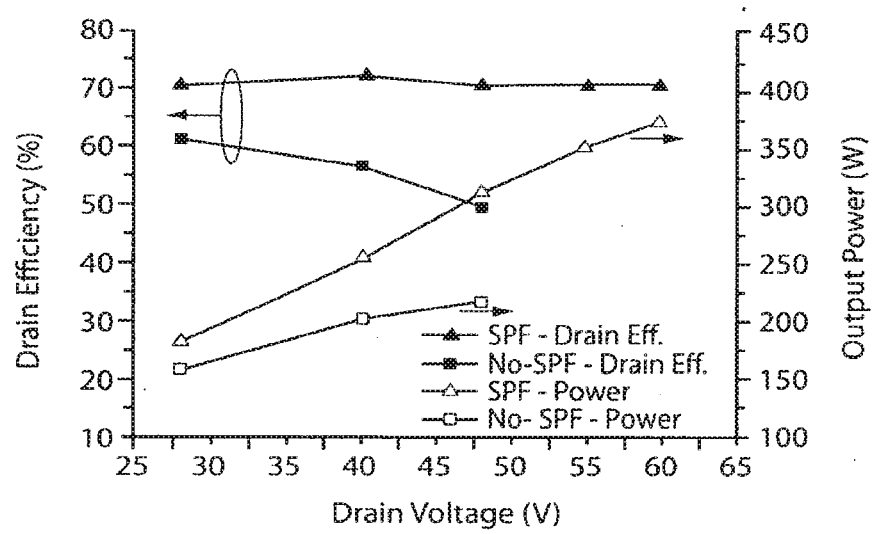
FIG. 11 is a graph of pulsed $P_{sat}$ and drain efficiency versus drain bias for a 36 mm gallium nitride material transistor with a source field plate as described in Example 1.
Figure 12:
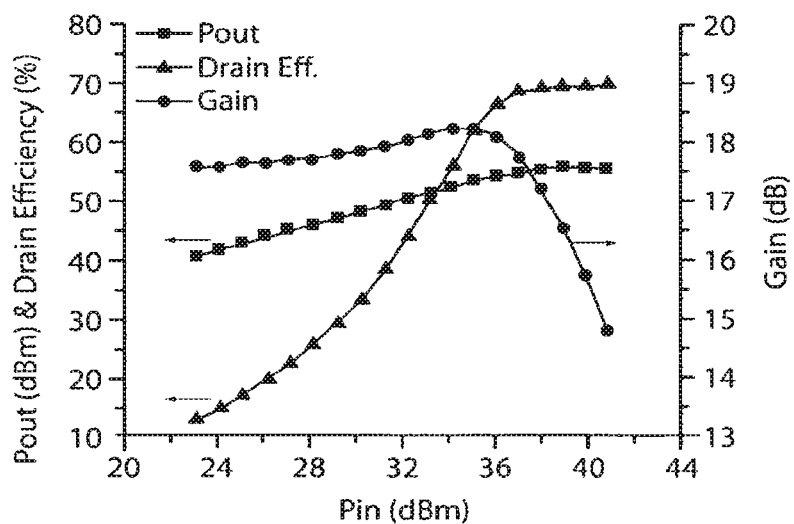
FIG. 12 shows a pulsed RF power sweep at a bias condition of $V_d=60$ V and $I_{dq}=1$ A for a 36 mm gallium nitride material transistor with a source field plate as described in Example 1.
Figure 13:
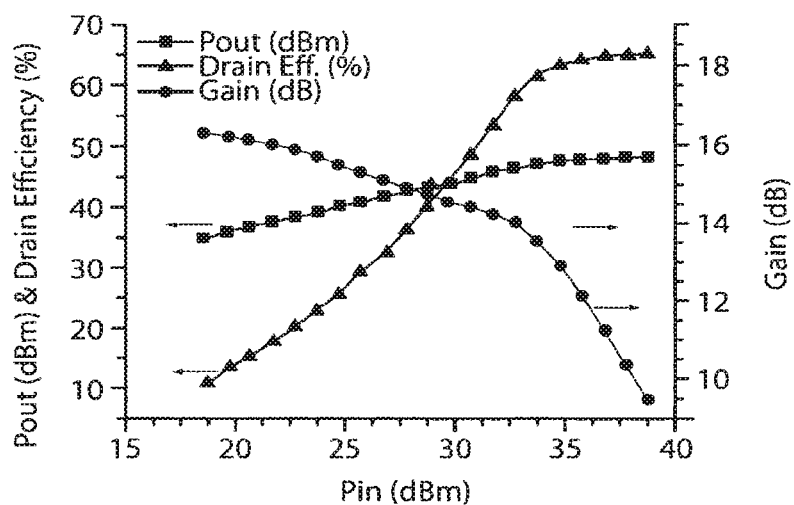
FIG. 13 is a graph of a CW RF power sweep at a bias condition of $V_d=60$ V and $I_{dq}=1$ A for a 36 mm gallium nitride material transistor with a source field plate as described in Example 1.

Pulsed RF power measurements were performed on both devices with and without source field plates. The RF input was pulsed with a 300 μs pulse width and a duty cycle of 1% at 2.14 GHz. The devices were held at a constant DC bias that produced an $I_{DQ}$ of 1 A at each of the drain voltages. The impedance states were optimized for maximum output power. FIG. 11 demonstrates the disparity in the performance of $P_{sat}$ and $\eta_{max}$ between devices with and without a source field plate. FIG. 12 shows the power sweep from a device with a source field plate operated at a drain bias of 60 V. The device produced 368 W (10.2 W/mm) of output power with a maximum drain efficiency of 70% and 17.5 dB of small signal gain. The CW performance of this device was measured at 28 V and is shown in FIG. 13. The device is demonstrated 65.5 W (1.8 W/mm) of $P_{sat}$, a $\eta_{max}$ of 65% and 16 dB of small signal gain.

Figure 14:
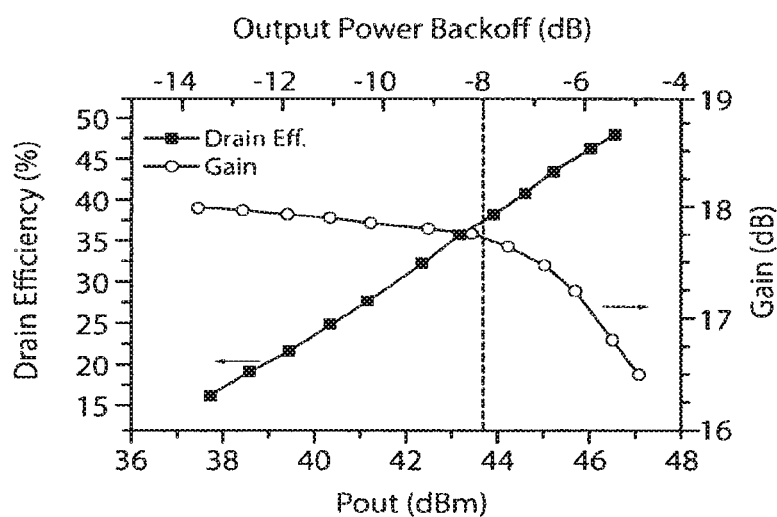
FIG. 14 is a graph showing backed-off performance for a 36 mm gallium nitride material transistor with a source field plate under a two-carrier WCDMA signal at $V_d=48$ V and $I_{dq}=1$ A as described in Example 1.

The linear performance of the transistor is evaluated by measuring the device at a backed-off power using a two carrier WCDMA signal (Test Model 1 with 64 users and 8.5 dB peak to average ratio), which is a typical measurement standard for 3G wireless basestation infrastructure applications. FIG. 14 shows the backed-off performance of the device. At a back-off of 8 dB the device delivers ~20.5 W with ~35% of drain efficiency and ~17.5 dB of gain when biased at $V_D$=48V and an $I_{DQ}$=1 A.

Extensive reliability testing was been performed at a drain voltage of 28 V and junction temperature of 200° C. on the device without the source field plate. Testing to date includes >100,000 device hours of 28 V DC stress across 130 devices. When extrapolating these devices to a 20-year operating life, a degradation of less than 10% is predicted. Additional RF stress testing at 28 V and 3 dB compression has been carried out for >5000 device hours across 15 devices. Extrapolations show 20-year drift rates of less than 1 dB.

Figure 15:
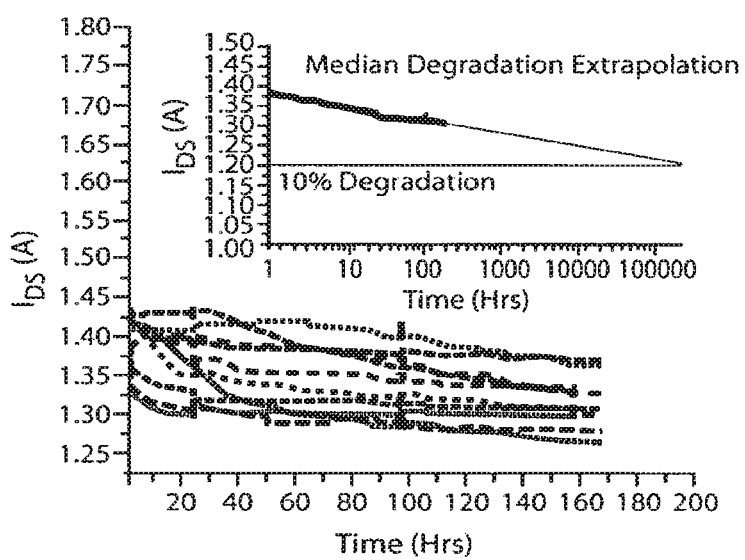
FIG. 15 is a graph of $I_{ds}$ versus time which shows the drain current drift of devices operated at 45 V and a junction temperature of 200° C. with the median degradation given on the inset graph with an extrapolation past the 20 year mark as described in Example 1.

DC stress data was taken on devices with a source field plate at a higher drain voltage of 48 V. In this study 10 SFP devices were biased to provide 48 V of drain voltage and 1.5 A of drain current to establish a junction temperature of 200° C. FIG. 15 shows the drift in the $I_{DS}$ over the first 168 hours for the 10 devices. The median of these preliminary data points was extrapolated out to 20 years yields and the drift of the drain current is less than 10%.

The addition of a source field plate produces a significant improvement in many of the critical performance metrics of the GaN on Si HFET. The device with the source field plate exhibits linear scaling of power and constant drain efficiency with increasing drain voltage to 60 V (e.g., See FIG. 11). In comparison, the output power in the device without the source field plate does not scale and the drain efficiency decreases with increasing drain voltage. The pulsed RF test conditions minimize thermal effects and therefore differences in performance at higher voltages are likely due to a dispersion phenomenon illustrated in the pulsed IV measurements in FIG. 8. In devices without the source field plate, the maximum drain current is suppressed and the transistor is unable to deliver its full potential of power and efficiency. As the drain voltage (and maximum electric field) of the device is increased, the difference in the $I_{DMAX}$ between the devices with and without the source field plate increases which results in the increasing difference in output power and efficiency. The source field plate redistributes the electric fields in the gate-drain region reducing the amount of the dispersion.

Another benefit of the SFP is the reduction of the gate drain capacitance in the intrinsic device. This property in combination with the ability to operate at high voltages allows for devices with higher levels of gain.

Pulsed output power densities of greater than 10 W/mm at a drain bias of 60 V have been demonstrated using AlGaN/GaN HFETs grown on high-resistivity Si (111) substrates. The addition of a source field plate is an important component for achieving high output power and drain efficiency at high drain voltages. The DC, RF and reliability performance of these devices demonstrate the viability of high power and high voltage GaN on Si technology for commercial and military applications.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method, comprising:
    forming a gallium nitride material region over a substrate;
    forming a source electrode, at least in part, over the gallium nitride material region;
    forming a gate electrode, at least in part, over the gallium nitride material region;
    forming a drain electrode, at least in part, over the gallium nitride material region;
    forming a passivation layer over the gallium nitride material region between the source electrode and the gate electrode, and between the gate electrode and the drain electrode, the gate electrode extending over a portion of the passivation layer a distance directly on the passivation layer in a direction of the drain electrode greater than a distance in a direction of the source electrode;
    forming a source field plate comprising a conductive material that is electrically connected to the source electrode;
    forming a via which extends through the gallium nitride material and the substrate to a backside of the substrate;
    forming a conductive material in the via and which electrically connects the source field plate to a conductive region at the backside of the substrate; and
    forming a barrier layer on sidewalls of the via so as to separate the conductive material from the gallium nitride material region and the substrate,
    wherein the barrier layer prevents chemical reactions between the conductive material and the substrate,
    wherein the barrier layer comprises one or more of titanium, tungsten, nickel and platinum.

2. The method of claim 1, wherein the source field plate extends over e gate electrode.

3. The method of claim 1, further comprising:
    forming an encapsulation layer over at least the gate electrode and the passivation layer.

4. The method of claim 3, wherein the source field plate extends onto a surface of the encapsulation layer facing away from the substrate.

5. The method of claim 1, wherein the source field plate is formed on a dielectric layer.

6. The method of claim 1, wherein the source field plate is formed on the passivation layer.

7. The method of claim 1, further comprising:
    forming a gate electrode via in the passivation layer in which the gate electrode is formed.

8. The method of claim 7, wherein a cross-sectional area at a top of the gate electrode via is greater than a cross-sectional area at a bottom of the gate electrode via.

9. The method of claim 1, further comprising:
    forming a compositionally-graded transition layer between the substrate and the gallium nitride material region.

10. The method of claim 1, wherein the barrier layer comprises more than one of titanium, tungsten, nickel and platinum alloyed to form a single composition.

11. The method of claim 1, wherein the barrier layer comprises more than one of titanium, tungsten, nickel and platinum formed as a series of different layers.

12. The method of claim 1, wherein the barrier layer comprises a titanium-tungsten alloy.

13. A method of manufacturing a transistor unit cell, the method comprising:
    forming a gallium nitride material region over a substrate;
    forming a plurality of transistor building block structures, each transistor building block structure comprising:
        a source electrode, at least in part, over the gallium nitride material region;
        a gate electrode, at least in part, over the gallium nitride material region;
        a drain electrode, at least in part, over the gallium nitride material region;
        a passivation layer over the gallium nitride material region between the source electrode and the gate electrode, and between the gate electrode and the drain electrode, the gate electrode extending over a portion of the passivation layer a distance directly on the passivation layer in a direction of the drain electrode greater than a distance in a direction of the source electrode;
        a source field plate comprising a conductive material that is electrically connected to the source electrode;
        a via which extends through the gallium nitride material and the substrate to a backside of the substrate;
        a conductive material in the via and which electrically connects the source field plate to a conductive region at the backside of the substrate; and
        a barrier layer on sidewalls of the via so as to separate the conductive material from the gallium nitride material region and the substrate, the barrier layer preventing chemical reactions between the conductive material and the substrate, the barrier layer comprising one or more of titanium, tungsten, nickel and platinum;
    connecting the source electrodes in the transistor building block structures to a common source pad;
    connecting the gate electrodes in the transistor building block structures to a common gate pad; and
    connecting the drain electrodes in the transistor building block structures to a common drain pad.

14. The method of claim 13, wherein the barrier layer in each transistor building block structure comprises more than one of titanium, tungsten, nickel and platinum alloyed to form a single composition.

15. The method of claim 13, wherein the barrier layer in each transistor building block structure comprises more than one of titanium, tungsten, nickel and platinum formed as a series of different layers.

16. The method of claim 13, wherein the barrier layer in each transistor building block structure comprises a titanium-tungsten alloy.

17. A method of manufacturing a power transistor, comprising:
    forming a gallium nitride material region over a substrate;
    forming a plurality of transistor unit cells arranged in parallel, each transistor unit cell comprising a plurality of transistor building block structures, each transistor building block structure comprising:
        a source electrode, at least in part, over the gallium nitride material region;
        a gate electrode, at least in part, over the gallium nitride material region;
        a drain electrode, at least in part, over the gallium nitride material region;
        a passivation layer over the gallium nitride material region between the source electrode and the gate electrode, and between the gate electrode and the drain electrode, the gate electrode extending over a portion of the passivation layer a distance directly on the passivation layer in a direction of the drain electrode greater than a distance in a direction of the source electrode;
a source field plate comprising a conductive material that is electrically connected to the source electrode;
a via which extends through the gallium nitride material and the substrate to a backside of the substrate;
a conductive material in the via and which electrically connects the source field plate to a conductive region at the backside of the substrate; and
a barrier layer on sidewalls of the via so as to separate the conductive material from the gallium nitride material region and the substrate, the barrier layer preventing chemical reactions between the conductive material and the substrate, the barrier layer comprising one or more of titanium, tungsten, nickel and platinum,
wherein the source electrodes in the transistor building block structures are connected to a common source pad in the respective transistor unit cells,
wherein the gate electrodes in the transistor building block structures are connected to a common gate pad in the respective transistor unit cells,
wherein the drain electrodes in the transistor building block structures are connected to a common drain pad in the respective transistor unit cells;
connecting the source pads in the transistor unit cells to a source bus;
connecting the drain pads in the transistor unit cells to a drain bus; and
connecting the gate pads in the transistor unit cells to a gate bus.

18. The method of claim 17, wherein the barrier layer in each transistor building block structure comprises more than one of titanium, tungsten, nickel and platinum alloyed to form a single composition.

19. The method of claim 17, wherein the barrier layer in each transistor building block structure comprises more than one of titanium, tungsten, nickel and platinum formed as a series of different layers.

20. The method of claim 17, wherein the barrier in each transistor building block structure comprises a titanium-tungsten alloy.

* * * * *